United States Patent [19]

Tsuji

[11] Patent Number: 5,530,282
[45] Date of Patent: Jun. 25, 1996

[54] SEMICONDUCTOR DEVICE HAVING A MULTILAYER INTERCONNECTION STRUCTURE

[75] Inventor: Masahiro Tsuji, Kyoto, Japan

[73] Assignee: Rohm Co., Ltd., Kyoto, Japan

[21] Appl. No.: 513,253

[22] Filed: Aug. 10, 1995

[30] Foreign Application Priority Data

Apr. 15, 1993 [JP] Japan ............................. 5-114063

[51] Int. Cl.⁶ ................... H01L 23/495; H01L 23/48
[52] U.S. Cl. ........................ 257/666; 257/668; 257/735
[58] Field of Search ........................ 257/666, 668, 257/672, 676, 700, 735, 736, 737, 774, 778, 673

[56] References Cited

U.S. PATENT DOCUMENTS

| | | | |
|---|---|---|---|
| 4,300,153 | 11/1981 | Hayakawa et al. | 257/778 |
| 5,304,843 | 4/1994 | Takubo et al. | 257/672 |
| 5,331,203 | 7/1994 | Wojnarowski et al. | 257/700 |
| 5,349,238 | 9/1994 | Ohsawa et al. | 257/736 |

FOREIGN PATENT DOCUMENTS

| | | | |
|---|---|---|---|
| 63274141 | 5/1990 | Japan | 257/672 |
| 64231205 | 4/1991 | Japan | 257/672 |

*Primary Examiner*—Sara W. Crane
*Assistant Examiner*—Carl Whitehead, Jr.
*Attorney, Agent, or Firm*—Dickstein, Shapiro & Morin

[57] ABSTRACT

A semiconductor device having a increased freedom of design in the connection between an electrode and one or more inner leads. In a semiconductor device 2, a semiconductor element 4 is fixed onto a die pad 2 which is a part of a lead frame. On the surface of the semiconductor element 4 is formed an electrode (bonding pad) 5, which is electrically connected to an inner lead 3 through a bridge structure 10 comprising an insulating film 11 deposited at a lowermost position and a conductive thin film pattern 12 formed thereon.

7 Claims, 4 Drawing Sheets

PRIOR ART

SEMICONDUCTOR DEVICE HAVING A MULTILAYER INTERCONNECTION STRUCTURE

TECHNICAL FIELD OF THE INVENTION

This invention relates to a semiconductor device, and more particularly to a semiconductor device having a structure to electrically connect an electrode of a semiconductor element with one or more inner leads.

BACKGROUND ART

Typically, as a structure of connecting an electrode of a semiconductor element with one or more inner leads, bonding of a wire consisting of conductive material such as gold is well known.

The wire bonding connection structure is shown in FIG. 7. FIG. 7(a) is a partially enlarged plan view and FIG. 7(b) is a partially enlarged front view of the conventional wire bonding structure. In this structure, a ball 7-2 is formed at one end of the wire 7-1 consisting of conductive material such as gold or aluminum, and is bonded to the electrode (bonding pad) 5 provided on the semiconductor element 4. The other end of the wire 7-1 is connected to the inner lead 3 with a wedge bonding technique, thereby, the bonding pad 5 on the semiconductor element 4 and the inner lead 3 are electrically connected to each other.

However, the above described conventional structure has several problems.

First, the number of inner leads increases and the space D1 between the inner leads of the lead frame shaped by etching or punching becomes very narrow, as the semiconductor elements are highly integrated and involve multiple functions. As is already known, the size of the space D1 between the inner leads 3 is defined by the thickness of the metal sheet used for a lead frame, and the minimum distance is limited to this thickness. Accordingly, the distance D2 between the bonding pad 5 and the inner lead 3 inevitably becomes long, which means lengthening of the wire 7-1. When the wire 7-1 becomes long, it is caught in the flow of resin which is injected at high pressure during the molding process. This causes a short circuit by touching with other wires or with the semiconductor element 4. In order to avoid this, the wire must be shortened. However, since it is impossible to bring the inner lead 3 close to the semiconductor element 4, the bonding pad 5 must be brought close to the inner lead 3. This results in an increase of the area of the semiconductor element 4 to an area larger than that necessary for serving its functions, and the number of the semiconductor element per wafer decreases and the cost rises.

Secondly, cross connection of the wire 7-1 is not used because it is apt to cause a short circuit by contact of the wire 7-1.

Thirdly, in a wire bonding connection, one end of the wire is always connected by wedge bonding, which needs a larger contact area than ball bonding because the edge of the capillary is pressed onto the connected surface. Thus, when directly connecting two bonding pads 5 on a single semiconductor element 4 or connecting two semiconductor elements 4 with wire, the area of the semiconductor element 4, as well as the area of the bonding pad 5 for wedge bonding, become large. So such a direct connection between the bonding pad 5 is not employed in reality.

As another connecting structure, there is the TAB (Tape Automated Bonding) method which meets with the high integration and multi-pin structure of a semiconductor device. This method, however, has not come into wide use because it requires a dedicated mounting apparatus since a film carrier itself is mounted onto the substrate.

SUMMARY OF THE INVENTION

Therefore, it is an object of the present invention to provide a semiconductor device which (i)does not require a large area for the semiconductor element, (ii)has a high freedom in the connecting design between the bonding pad and the inner lead, (iii)can realize connection between a bonding pad of two different semiconductor elements or between two bonding pads on a semiconductor element, and (iv)only requires an ordinary lead frame used for wire bonding.

In order to achieve the above described object, a semiconductor device of the present invention provides a bridge structure for electrically connecting an electrode of a semiconductor element to an inner lead. In a semiconductor device having at least one semiconductor element fixed onto a lead frame, a bonding pad on the semiconductor element and an inner lead of the lead frame being resin sealed, the bridge structure of the present invention comprises an insulating layer and a conductive thin film pattern where an insulating layer is arranged at a lowermost position. By arranging an insulating layer at a lowermost position, (that is, between the semiconductor element and the conductive film pattern), a short circuit can be avoided which is caused by contact of the semiconductor element and the conductive film pattern.

Other objects and advantages will be apparent from the following description, the accompanyings and the appended claims.

DETAILED DESCRIPTION OF THE PREFERRED EMBODIMENTS

First Embodiment

Figure 1:
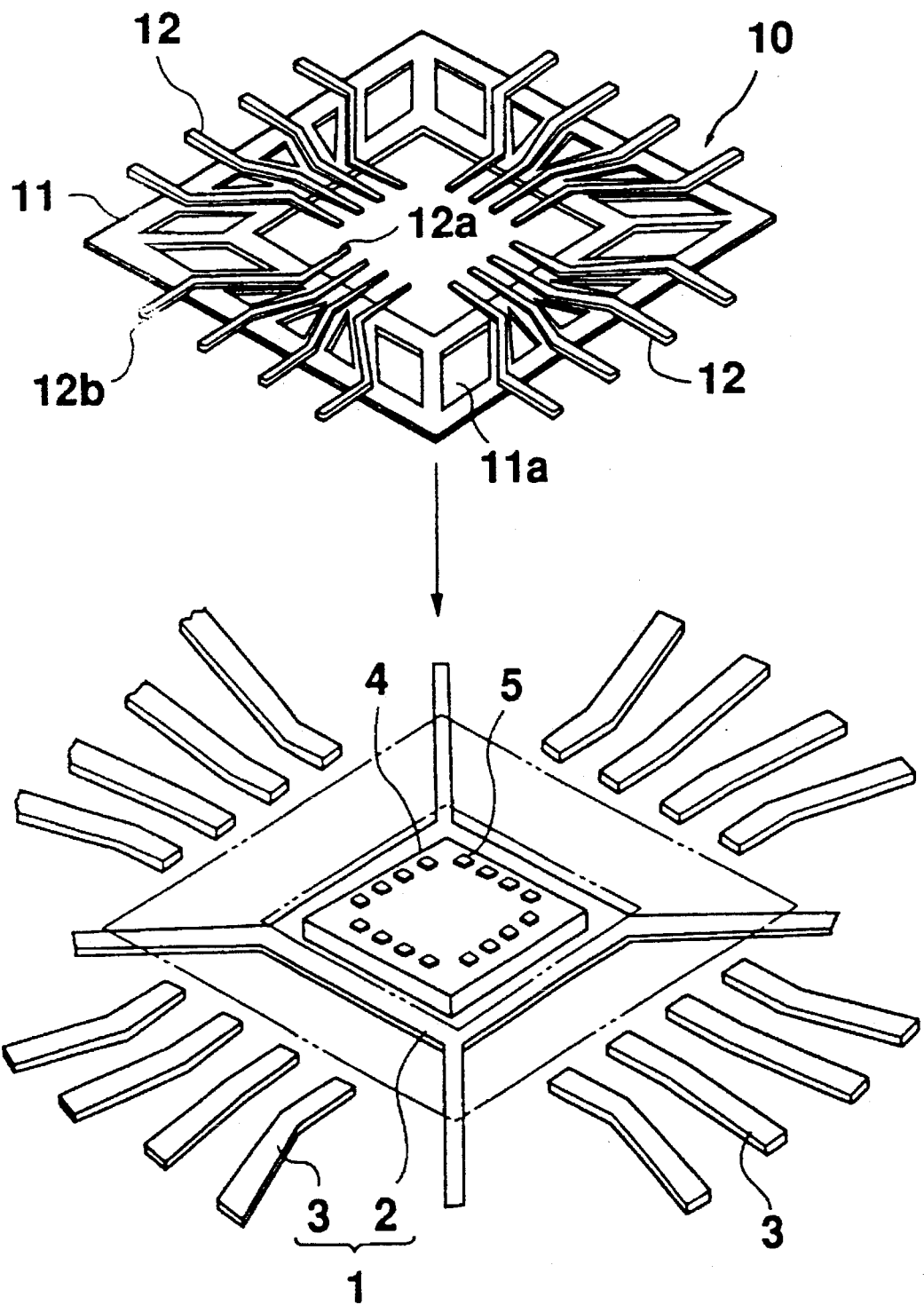
FIG. 1 is an exploded perspective view of the semiconductor device of the present invention.
Figure 2:
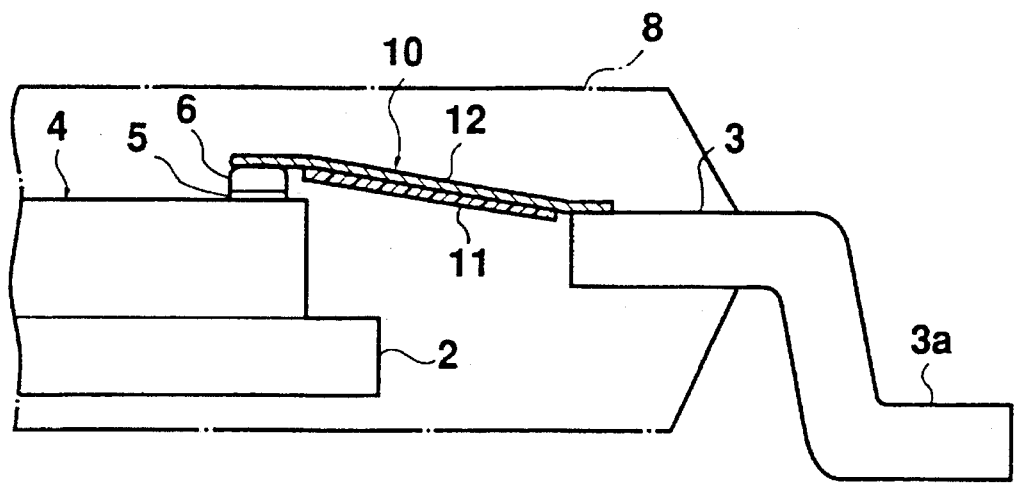
FIG. 2 is a cross-sectional view of the bridge structure in the semiconductor device shown in FIG. 1.

A semiconductor device according to the first embodiment of the present invention is shown in FIG. 1, and its bridge structure is illustrated in FIG. 2.

A lead frame 1 is formed with a thin metal sheet such as iron alloy or copper alloy. The lead frame 1 includes a rectangular die pad 2 and a plurality of inner leads 3 arranged around the die pad 2. The inner leads 3 are connected to outer leads 3a led from a mold 8.

Semiconductor elements 4 are fixed onto the die pad 2 through, for example, conductive paste. On the surface of the semiconductor element 4 are formed a plurality of bonding pads 5 for receiving electrical signals. A bump 6 is formed onto each of the bonding pads 5 for facilltating the connection between the bonding pad 5 and a bridge 10. The bump 6 is formed through screen printing transfer or vapor deposition with conductor material such as gold or solder. Preferably, the melting point of such conductor materials is 240° C. or higher so as to resist heat for soldering when the semiconductor device is mounted onto the substrate.

The bridge structure 10 is for electrically connecting each of the bonding pads 5 of the semiconductor element 4 to a predetermined inner lead 3. The bridge structure 10 comprises a ring-like (enclosed) insulating film 11 and a plurality of conductive thin film patterns 12 formed onto the insulating film 11. The insulating film 11 is made from a resin having an electrically insulating property. Preferably, the insulating film 11 is heat resistant when the connection between the bridge structure 10 and the semiconductor element 4 is conducted during a heating process, or thermosetting resin such as an epoxy resin is employed as a sealing resin. In this embodiment, 50 μm thickness of polyimide resin was used.

The conductive thin film pattern 12 is shaped by etching a conductive thin film, such as several tens of μm thickness of gold, with a resist mask formed by a photo lithography technique. The conductive thin film pattern 12 is made from material with one tenth the thickness of the lead frame 1. One end 12a of the conductive thin film pattern 12 extending into the center opening of the insulating film 11 is opposite to the bonding pad 5 on the semiconductor element 4, while the other end 12b extending from the outer periphery of the insulating film 11 is opposite to the inner lead 3.

Through holes 11a are formed on the insulating film 11 of the above described bridge structure 10, so as to achieve a smooth flow of the resin when molding and to firmly fix the bridge structure with molding resin as the resin encapsulates the whole of the bridge structure.

The connection between the bonding pad 5 and the inner lead 3 is carried out with the bridge structure, by arranging the insulating film 11 at the bottom and positioning each end 12a and 12b of the conductive thin film 12 so as to oppose the bonding pad 5 on the semiconductor element 4 and the inner lead 3, respectively, and then connecting one end 12a of the conductive thin film pattern 12 to the bonding pad 5, and the other end 12b to the inner lead 3 under an appropriate heating atmosphere (In the case that the bump 6 is solder, connection is done at its melting point.).

Although, in this embodiment, connection between the other end 12b of the conductive thin film pattern 12 and the inner lead 3 is done by heat bonding or ultra sonic bonding, the inner lead may be connected to the conductive thin film pattern via a solder bump which has been formed on the inner lead beforehand.

The bridge structure 10 is not limited to the above example. For example, as shown in the bridge structure 10A of FIG. 3, another insulating film 13 may be formed covering the conductive thin film pattern 12 to protect the pattern 12.

Figure 4:
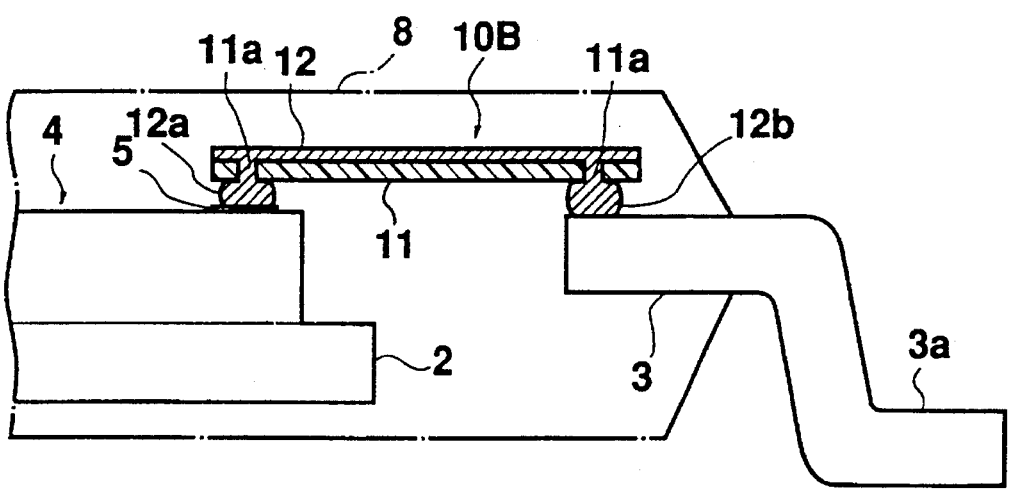
FIG. 4 shows another modification of the bridge structure of FIG. 2.

Another modification of the bridge structure 10B is shown in FIG. 4. In this structure, bumps 12a and 12b are formed on the underside of the insulating film, which are connected to the conductive thin film pattern 12 through the through holes 11a and 11b, respectively, formed in the insulating film 11. Thus, the bonding pad 5 on the semiconductor element 4 is connected to the inner lead 3 with the bridge 10B without extending from both ends of the conductive thin film pattern 12.

Second Embodiment

Figure 5:
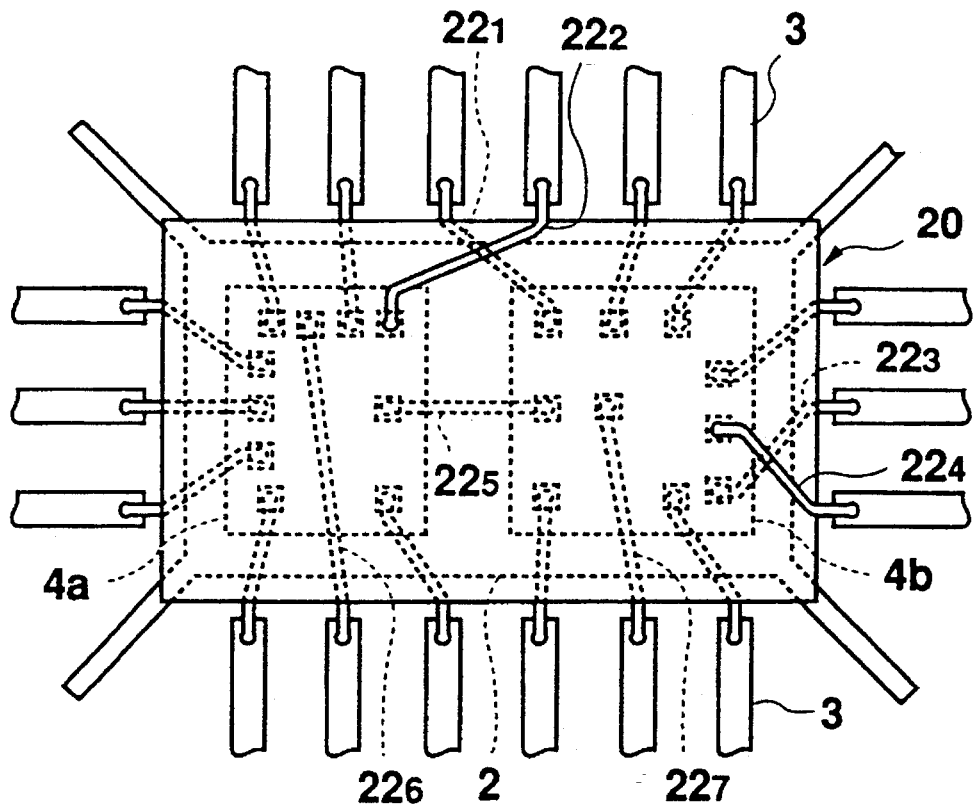
FIG. 5 is a plan view of the semiconductor device according to the second embodiment of the present invention.
Figure 6:
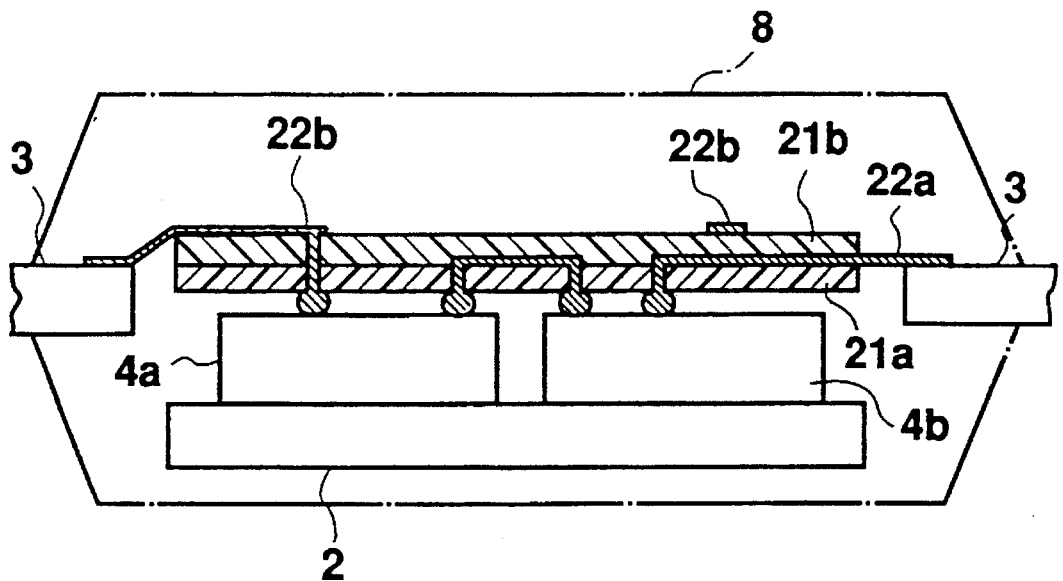
FIG. 6 is a cross-sectional view of the bridge structure in the semiconductor device shown in FIG. 5.

The second embodiment of the present invention is an application of the bridge structure to a multi chip module (i.e. a device mounting a plurality of semiconductor elements thereon). FIG. 5 is a plan view of the bridging in a multi chip module, and FIG. 6 is a cross-sectional view of the bridge structure. The multi chip module of this embodiment includes a connecting structure such as crossing of the conductive connecter or inter-semiconductor elements connection, which is difficult to achieve with the conventional wire bonding technique. Of course, this connecting structure is not only for a multi chip module, but is also applicable to a semiconductor device having a single semiconductor element.

As shown in FIG. 5, two semiconductor elements 4a and 4b are fixed onto the die pad 2, and each of the plurality of bonding pads on the semiconductor element are connected to the corresponding inner leads 3 with a bridge structure 20. In the conductive thin film pattern of this bridge structure 20, patterns 22-1 and 22-2 are crossing each other, and 22-3 and 22-4 are also crossing. Pattern 22-5 directly connects between the two semiconductor elements 4a and 4b. Pattern 22-6 is connected to the inner read 3 positioned at the opposite side of the semiconductor element, while pattern 22-7 is connected to the inner read 3 positioned at the center of the semiconductor element.

In order to realize crossing of the conductive thin film pattern 22, the bridge structure 20 of this embodiment has a multi layer structure as shown in FIG. 6.

The lowermost layer is a first insulating film 21a, on which a first conductive thin film pattern 22a is formed. On the pattern 22a is a second insulating film 21b, and the top is a second conductive thin film pattern 22b (which is shown with a solid line in FIG. 5). One end of the conductive thin film pattern 22 is connected to each of the bonding pads on the semiconductor elements 4a and 4b via bump, while the other end of the pattern 22 extending from the periphery of the insulating films 21a and 21b is connected to the corresponding inner lead 3.

Figure 3:
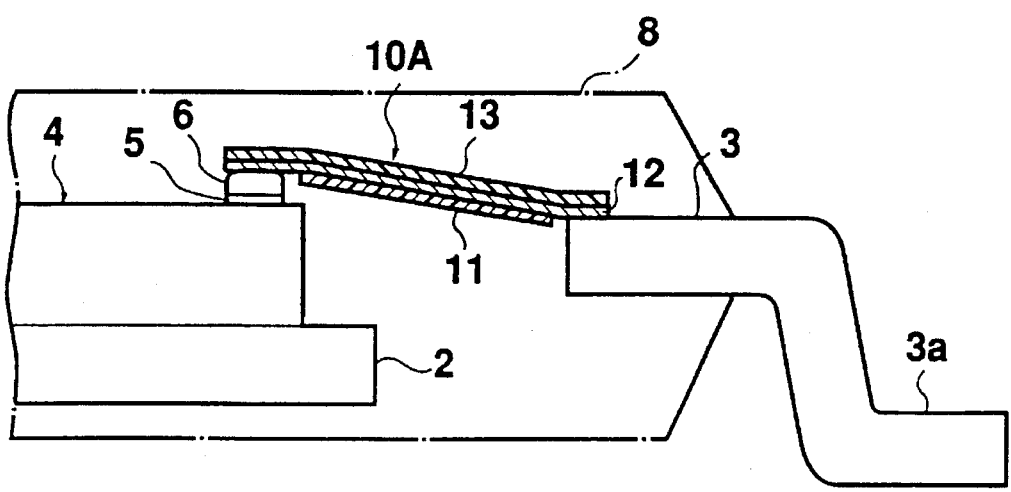
FIG. 3 illustrates a modification of the bridge structure of FIG. 2.

It is apparent that the bridge structure 20 of this embodiment also has various modifications as is shown in FIGS. 3 and 4.

As is apparent from the above description, according to the present invention, each electrode on the semiconductor element is connected to the inner lead with a bridge structure comprising a lowermost insulating film and at least one conductive thin film pattern formed thereon, thereby avoiding a short circuit caused by contact between the semiconductor element and the conductive pattern. Furthermore arrangement of semiconductor elements is freely designed without considering a length of the bridging portion (corresponding to a wire), and connection between the electrode and the inner lead is achieved with a minimum area of the semiconductor element required for realizing an essential function of the semiconductor element. Thus, the bridge structure of the present invention has the following advantages:

(i) The area of the semiconductor clement is minimized, which reduces manufacturing cost as well as occurrences of package crack in a thin type QFP (Quad Flat Package).

Figure 7A:
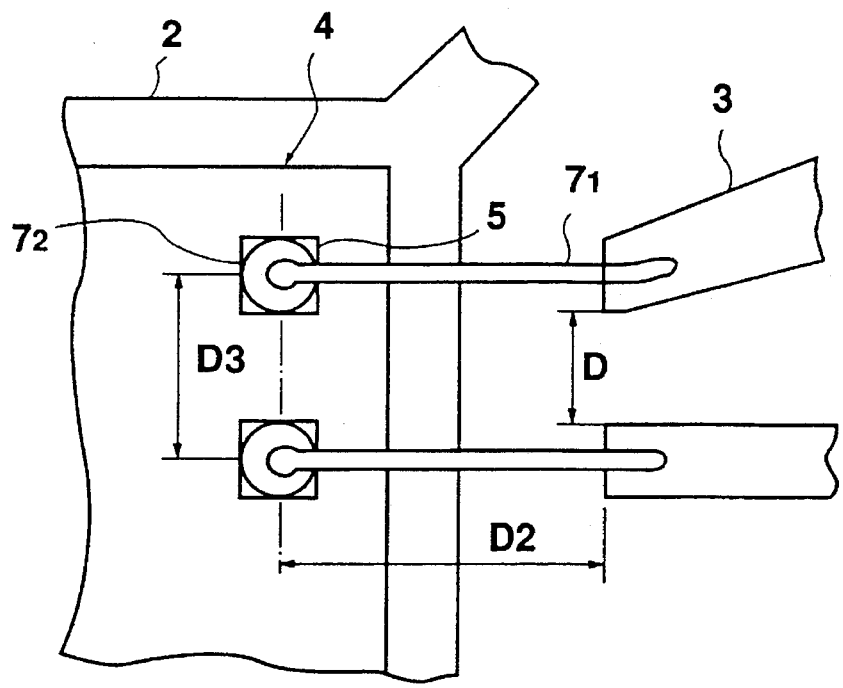
FIGS. 7(a) and 7(b) illustrate a conventional wire bonding.
Figure 7B:
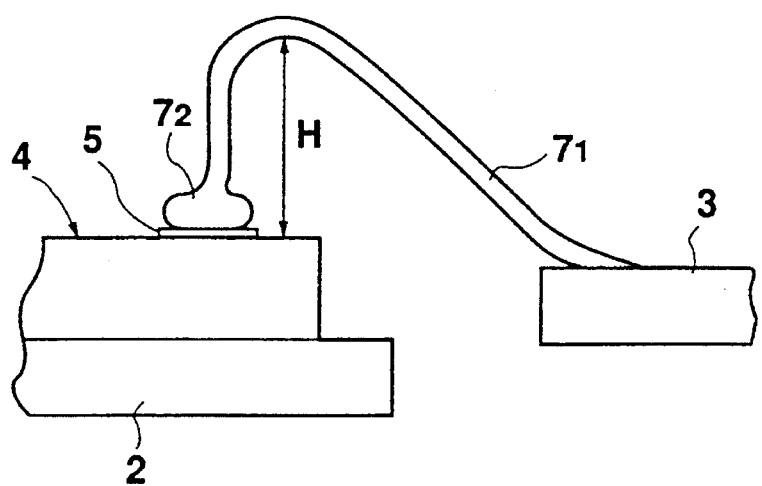

(ii) Both the electrode area and the space D3 between the electrodes (shown in FIG. 7) are decreased, and inter-semiconductor element connection or inter-electrode connection on a single semiconductor element is facilitated, since there is no necessity to use a capillary as is required in the conventional wire bonding technique because the conductive thin film pattern shaped in a predetermined pattern is used for electrical connection.

(iii) A package can be shaped thinner compared with the conventional wire bonding since a loop height H (generally a hundred or several tens of μm) is not required.

This detailed description is set forth only for the purpose of illustrating examples of the present invention and should not be considered to limit the scope thereof. It should be understood that various modifications can be made without departing from the scope of the invention.

What is claimed is:

1. A semiconductor device, comprising:

at least one semiconductor element fixed onto a die pad;

a first electrode formed on the at least one semiconductor element;

a first inner lead spaced from the first electrode;

a first bridge structure electrically connecting the first electrode and the first inner lead, the first bridge structure including a lower insulating film, an electrically conductive thin film pattern formed on the lower insulating film and an upper insulating film formed on the electrically conductive thin film pattern, the electrically conductive thin film pattern having a first end electrically connected to the first electrode and a second end electrically connected to the first inner lead;

a second electrode formed on the at least one semiconductor element;

a second inner lead spaced from the second electrode; and a second bridge structure electrically connecting the second electrode and the second inner lead, the second bridge structure including an electrically conductive thin film pattern formed on said upper insulating film, the electrically conductive thin film pattern having a first end electrically connected to the second electrode and a second end electrically connected to the second inner lead.

2. The semiconductor device of claim 1, wherein a single-insulating film forms said lower insulating film of said first bridge structure and said lower insulating film of said second bridge structure.

3. The semiconductor device of claim 1, wherein a single insulating film forms said upper insulating film of said first bridge structure and said upper insulating film of said second bridge structure.

4. The semiconductor device of claim 1, further comprising a second semiconductor element fixed onto said die pad;

a first electrode formed on the second semiconductor element;

a second inner lead spaced from the first electrode; and a second bridge structure electrically connecting the first electrode formed on the second semiconductor element and the second inner lead, the second bridge structure including a lower insulating film, an electrically conductive thin film pattern formed on the lower insulating film and an upper insulating film formed on the electrically conductive thin film pattern, the electrically conductive thin film pattern having a first end electrically connected to the first electrode formed on the second semiconductor element and a second end electrically connected to the second inner lead.

5. The semiconductor device of claim 4, further comprising a second electrode formed on the second semiconductor element;

a third inner lead spaced from the second electrode; and a third bridge structure electrically connecting the second electrode formed on the second semiconductor element and the third inner lead, the third bridge structure including an electrically conductive thin film pattern formed on the upper insulating film, the electrically conductive thin film pattern having a first end electrically connected to the second electrode formed on the second semiconductor device and a second end electrically connected to the third inner lead.

6. The semiconductor device of claim 5, wherein a single insulating film forms said lower insulating film of said first bridge structure, said lower insulating film of said second bridge structure and said lower insulating film of said third bridge structure.

7. The semiconductor device of claim 5, wherein a single insulating film forms said upper insulating film of said first bridge structure, said upper insulating film of said second bridge structure and said upper insulating film of said third bridge structure.

* * * * *

UNITED STATES PATENT AND TRADEMARK OFFICE
CERTIFICATE OF CORRECTION

PATENT NO. : 5,530,282
DATED : June 25, 1996
INVENTOR(S) : Masahiro TSUJI

It is certified that error appears in the above-indentified patent and that said Letters Patent is hereby corrected as shown below:

On the Title page of the patent, in the left hand column, between items 22 and 30, item 63 should be added as follows:

-- Related U.S. Application Data
[63] Continuation of Ser. No. 08/207,149, March 8, 1994, now abandoned. --

Column 1, line 5, add the following:

-- This application is a continuation of application Serial No. 08/207,149, filed March 8, 1994, now abandoned. --

Signed and Sealed this

Twenty-ninth Day of October 1996

Attest:

BRUCE LEHMAN

Attesting Officer

Commissioner of Patents and Trademarks